(12) United States Patent
Moens et al.

(10) Patent No.: US 9,741,840 B1
(45) Date of Patent: Aug. 22, 2017

(54) ELECTRONIC DEVICE INCLUDING A MULTIPLE CHANNEL HEMT AND AN INSULATED GATE ELECTRODE

(71) Applicant: SEMICONDUCTOR COMPONENTS INDUSTRIES, LLC, Phoenix, AZ (US)

(72) Inventors: Peter Moens, Erwetegem (BE); Jia Guo, Durham, NC (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/270,905

(22) Filed: Sep. 20, 2016

Related U.S. Application Data

(63) Continuation-in-part of application No. 15/182,407, filed on Jun. 14, 2016.

(51) Int. Cl.
*H01L 21/00* (2006.01)
*H01L 29/778* (2006.01)
(Continued)

(52) U.S. Cl.
CPC ...... *H01L 29/7783* (2013.01); *H01L 21/8252* (2013.01); *H01L 27/0605* (2013.01);
(Continued)

(58) Field of Classification Search
CPC ............ H01L 27/0883; H01L 21/8252; H01L 29/1033; H01L 29/2003; H01L 29/205;
(Continued)

(56) References Cited

U.S. PATENT DOCUMENTS

| | | | |
|---|---|---|---|
| 7,498,872 B2* | 3/2009 | Nishimoto | G06F 17/5063 257/288 |
| 2003/0141518 A1* | 7/2003 | Yokogawa | H01L 21/8252 257/194 |

(Continued)

OTHER PUBLICATIONS

Arch, D.K. et al., "Superlattice Conduction in Superlattice Modulation-Doped Field-Effect Transistors," Journal of Applied Physics vol. 61, No. 4, dated Feb. 15, 1987, pp. 1503-1509.
(Continued)

*Primary Examiner* — Nicholas Tobergte
(74) *Attorney, Agent, or Firm* — Abel Law Group, LLP

(57) ABSTRACT

An electronic device can include a lower channel layer, an upper channel layer overlying the lower channel layer and having an opening extending through the upper channel layer. The electronic device can further include an insulator within the opening; and a gate electrode extending into the opening, wherein the insulator is disposed between the gate electrode and the second channel layer. A double channel transistor can include the lower and upper channel layers and the gate electrode. In a further embodiment, a conductive member can be used to electrically short the channel layers near the gate electrode. In an embodiment, the transistor can be enhancement-mode transistor. A process can include forming the insulator such that it is in the form of a sidewall spacer or as an insulating layer along the sidewall and bottom of the opening through the upper channel layer.

20 Claims, 8 Drawing Sheets

(51) Int. Cl.
  *H01L 29/20* (2006.01)
  *H01L 29/205* (2006.01)
  *H01L 29/10* (2006.01)
  *H01L 29/40* (2006.01)
  *H01L 27/06* (2006.01)
  *H01L 29/66* (2006.01)
  *H01L 21/8252* (2006.01)

(52) U.S. Cl.
  CPC ...... *H01L 29/1029* (2013.01); *H01L 29/2003* (2013.01); *H01L 29/205* (2013.01); *H01L 29/404* (2013.01); *H01L 29/408* (2013.01); *H01L 29/66462* (2013.01)

(58) Field of Classification Search
  CPC ........... H01L 29/4236; H01L 29/66462; H01L 29/7787
  See application file for complete search history.

(56) References Cited

U.S. PATENT DOCUMENTS

| | | | |
|---|---|---|---|
| 2009/0065810 A1 | 3/2009 | Honea et al. | |
| 2009/0072240 A1* | 3/2009 | Suh | H01L 29/2003 257/76 |
| 2012/0292665 A1* | 11/2012 | Marino | H01L 29/1029 257/194 |
| 2013/0043485 A1* | 2/2013 | Ueno | H01L 29/42316 257/76 |
| 2013/0141156 A1* | 6/2013 | Teo | H01L 29/7783 327/530 |
| 2013/0240911 A1 | 9/2013 | Beach | |
| 2014/0266324 A1* | 9/2014 | Teo | H01L 29/2003 327/109 |
| 2015/0249134 A1* | 9/2015 | Ostermaier | H01L 29/0649 257/76 |

OTHER PUBLICATIONS

Baba, Toshio et al., "High Performance (AlAx/n-GaAs Superlattice)/GaAs 2DEGFETs with Stabilized Threshold Voltage," Japanese Journal of Applied Physics, vol. 23, No. 8, dated Aug. 1984, pp. L654-L656.

Guo, Jia et al., "Ultra-Scaled AlN/GaN Enhancement-& Depletion-Mode Nanoribbon HEMTs," ISDRS, dated Dec. 9-11, 2009, 2 pages.

Howell, Robert S. et al, "The Super-Lattice Castellated Field Effect Transistor (SLCFET): A Novel High Performance Transistor Topology Ideal for RF Switching," IEDM Technical Digest, dated 2014, pp. 291-294.

* cited by examiner

ELECTRONIC DEVICE INCLUDING A MULTIPLE CHANNEL HEMT AND AN INSULATED GATE ELECTRODE

CROSS REFERENCE TO RELATED APPLICATION

This application is a continuation-in-part of and claims priority under 35 U.S.C. §120 to U.S. patent application Ser. No. 15/182,407 entitled "Electronic Device Including a Multiple Channel HEMT and an Insulated Gate Electrode" by Moens et al. filed Jun. 14, 2016, which is assigned to the current assignee hereof and incorporated herein by reference in its entirety.

FIELD OF THE DISCLOSURE

The present disclosure relates to electronic devices, and more particularly to, electronic devices that include high-electron mobility transistors having at least two channel layers and an insulated gate electrode.

RELATED ART

High electron mobility transistors (HEMTs) can have a two dimensional electron gas (2DEG) with a relatively low resistivity, and such resistivity can be affected by the amount of aluminum within and AlGaN barrier layer. As the Al content increases, the resistivity becomes lower. However, when the Al content is too high, more strain can result, thus increasing the risk of wafer breakage and inverse piezo-electric effect. Alternatively, an AlN spacer has been proposed, but obtaining a good ohmic contact can be difficult to obtain.

BRIEF DESCRIPTION OF THE DRAWINGS

Embodiments are illustrated by way of example and are not limited in the accompanying figures.

Figure 1:
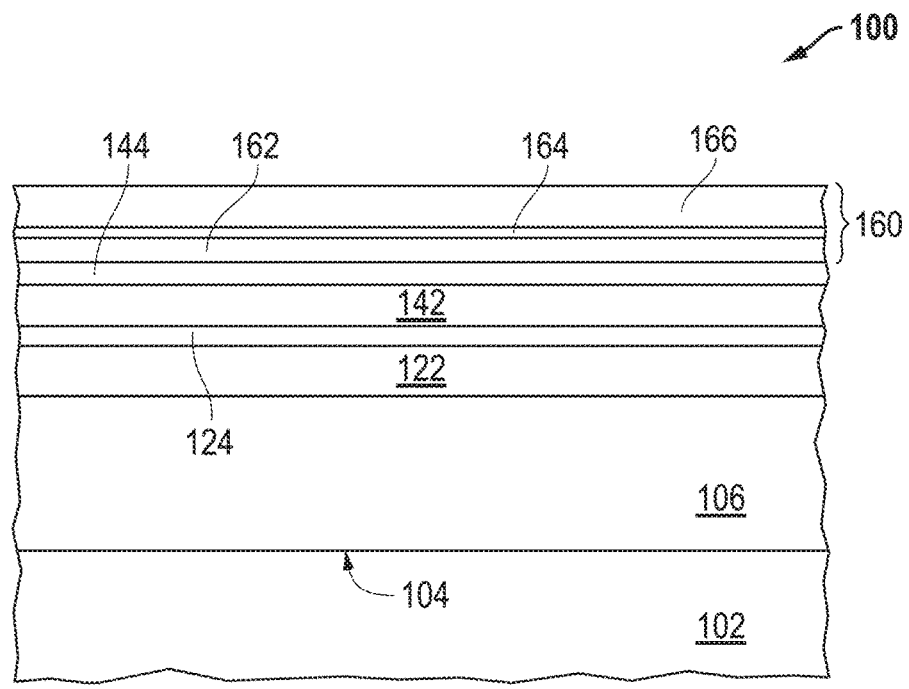
FIG. 1 includes an illustration of a portion of a workpiece including a substrate, a buffer layer, channel layers, semiconductor layers, and a passivation layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_vGa_{(1-v)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The term "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a first channel layer; a second channel layer overlying the first channel layer and having an opening extending therethrough; an insulator within the opening; and a gate electrode extending into the opening, wherein the insulator is disposed between the gate electrode and the second channel layer, wherein a double channel transistor includes the first and second channel layers and the gate electrode. A process for forming the electronic device can include providing a workpiece including a substrate, a first channel layer overlying the substrate, and a second channel layer overlying the first channel layer; patterning the second channel layer to define an opening extending therethrough; forming an insulator within the opening; and forming a first gate electrode that extends into the opening after forming the insulator, wherein a first transistor includes the first and second channel regions and the first gate electrode. The electronic device and process can be used in a HEMT as an enhancement-mode transistor.

In another aspect an electronic device can include a cascode circuit comprising a switch transistor and a control transistor. The switch transistor includes at least two channel layers, wherein the switch transistor comprises a first channel layer; a second channel layer overlying the first channel layer and having an opening extending therethrough; an insulator within the opening; and a switch gate electrode extending into the opening, wherein the insulator is disposed between the switch gate electrode and the second channel layer. The control transistor includes at least two channel layers, wherein the control transistor comprises the first channel layer; the second channel layer; and a control gate electrode, wherein all of the control electrode overlies the first and second channel layers. In the cascode circuit, the switch transistor and control transistors can be integrated with the same channel layers for both the control and switch transistors, wherein the control transistor is a depletion-mode transistor, and the switch transistor is an enhancement-mode transistor. Such a configuration can be used for many different types of semiconductor materials and is particularly well suited for HEMTs. Such HEMTs can be based on III-N semiconductor materials, and AlGaN and GaN in particular.

In a further aspect, an electronic device can include a transistor. The transistor can include a first channel layer, a second channel layer overlying the first channel layer, a source electrode, a drain electrode, and a conductive member. The conductive member can be electrically connected to the first and second channel layers and is spaced apart from the source and drain electrodes. The conductive member can help to increase the drain current and allows the transistor to turn on at a lower gate-to-source voltage as compared to the same transistor without the conductive member.

The concepts and design considerations are better understood after reading the embodiments that follow. Much of the description below will address GaN as the material of the channel layer as a specific example in order to simplify understanding of the concepts and design considerations. Clearly, embodiments of the present invention are not limited to a GaN channel layer. After reading the specification in its entirety, skilled artisans will appreciate that the embodiments are merely for illustrative purposes and do not limit scope of the appended claims.

A first set of embodiments are directed to an electronic device that includes a HEMT having two channel layers. Embodiments with more than two channel layers can be used and will be addressed later in this specification. After reading the specification, skilled artisans will be able to use the concepts described with respect to two channel layers and apply such concepts to HEMTs having more than two channel layers.

FIG. 1 includes an illustration of a cross-sectional view of a portion of a workpiece 100 that includes a substrate 102, a buffer layer 106, a lower channel layer 122, a lower semiconductor layer 124, an upper channel layer 142, and upper semiconductor layer 144, and a passivation layer 160 that includes a gate dielectric film 162, an intermediate film 164, and a capping film 166. The substrate 102 has a primary surface 104 and can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface 104 can be selected depending upon the composition of the layers that will be subsequently formed over the substrate 102.

The buffer layer 106 can help to epitaxially grow the overlying layers 122, 124, 142, and 144. The composition of the buffer layer 106 may depend on the composition of the lower channel layer 122. In an embodiment, the lower channel layer 122 includes GaN, and the buffer layer 106 includes AlGaN. The composition of the buffer layer 106 can be changed as a function of thickness, such that the buffer layer 106 has a relatively greater aluminum content closer to the substrate 102 and relatively greater gallium content closer to the lower channel layer 122. In a particular embodiment, the cation (metal atoms) content in the buffer layer 106 near the substrate 102 can be 10% to 100% Al with the remainder Ga, and the cation content in the buffer layer 106 near the lower channel layer 122 can be 0% to 50% Al with the remainder Ga. The buffer layer 106 can have a thickness in a range of approximately 1 micron to 10 microns.

The lower and upper channel layers 122 and 142 can include a monocrystalline compound semiconductor material. The lower channel layers 122 may include a compound semiconductor material different from the upper channel layer 142. In an embodiment, the upper channel layer 142 may allow for a higher Al content if needed or desired as compared to the lower channel layer 122. The lower channel layer 122 can include $Al_aGa_{(1-a)}N$, wherein 0≤a≤0.1, and the upper channel layer 142 can include $Al_cGa_{(1-c)}N$, wherein 0≤c≤0.15. In a particular embodiment, either or both of the lower and upper channel layers 122 and 142 include GaN (in the prior formulas, a=0 and c=0).

The lower channel layer 122 may have a sufficient thickness to reduce the likelihood that electrons from the 2DEG would become trapped in the buffer layer 106. The lower channel layer 122 can have a thickness in a range of 11 nm to 1000 nm, and in a particular embodiment, is in a range of 120 nm to 250 nm. A two dimensional hole gas (2DHG) can form along the interface between the upper channel layer 142 and the lower semiconductor layer 124. The upper channel layer 142 is further from the buffer layer 106, and therefore, the upper channel layer 142 can be thinner than the lower channel layer 122. The upper channel layer may have a thickness in a range of 10 nm to 200 nm, and in a particular embodiment, is in a range of 20 nm to 80 nm.

In an embodiment, current corresponding to the upper channel layer 142 may be higher than current corresponding to the lower channel layer 142. The current associated with each of the channel layers 122 and 142 can be affected by the Al content within the semiconductor layers 124 and 144. The lower semiconductor layer 124 may have a lower Al content as compared to the upper semiconductor layer 144, so that more current corresponds to the upper channel layer 142. In an embodiment, the lower semiconductor layer 124 may include at least 10% Al to allow for sufficient current. In an embodiment, the lower semiconductor layer 124 includes $Al_bGa_{(1-b)}N$, wherein 0.10≤b≤0.30. More Al content in the upper semiconductor layer 144 allows for higher current; however, too much Al content may cause too much strain within the device. In an embodiment, the upper semiconductor 144 includes $Al_dGa_{(1-d)}N$, wherein 0.15≤d≤0.35. The semiconductor layers 124 and 144 can have a thickness in a range of 10 nm to 40 nm. The semiconductor layers 124 and 144 can have the same or different thicknesses.

The layers 122, 124, 142, and 144 can be formed using an epitaxial growth technique, and thus the layers 122, 124, 142, and 144, and at least a portion of the buffer layer 106 can be monocrystalline. In a particular embodiment, the layers 122, 124, 142, and 144 can be formed using metalorganic chemical vapor deposition.

The passivation layer 160 allows for better surface passivation of the upper semiconductor layer 144 and limits the amount of charge trapped at the interface. In an embodiment, the passivation layer is formed before the upper semiconductor layer 144 is exposed to air, $O_2$, $H_2O$, or another reactive gas. The passivation layer can include a gate dielectric film 162, an intermediate film 164, and a capping film 166. The gate dielectric film 162 can include a silicon nitride, an aluminum oxide, a zirconium oxide, a hafnium oxide, a niobium oxide, another suitable gate dielectric material, or any combination thereof and have a thickness in a range of 5 nm to 40 nm. The intermediate film 164 can act as an etch-stop layer when etching the capping film 166. In an embodiment, the intermediate film 164 can include AlN and have a thickness in a range of 2 nm to 20 nm. The capping film 166 can protect the gate dielectric film 162. In an embodiment, the capping film 166 can include silicon nitride and have a thickness in a range of 20 nm to 500 nm. In another embodiment, the passivation layer 160 can include fewer or more films that may have the same or different compositions as described. When the intermediate film 164 includes AlN, an optional $Al_2O_3$ film (not illustrated) can be formed by oxidizing a portion of the intermediate film 164 in an oxidizing ambient, such as $O_2$, $N_2O$, or the like. The passivation layer 160 or any films of the passivation layer 160 can be formed using a chemical or physical vapor technique.

Figure 2:
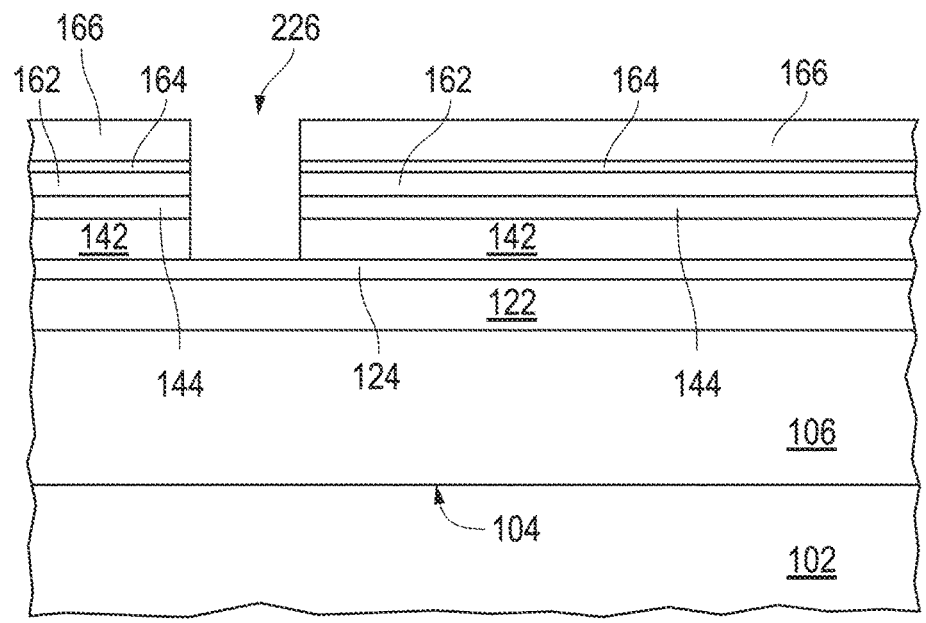
FIG. 2 includes an illustration of the workpiece of FIG. 1 after forming a gate electrode opening.

FIG. 2 includes an illustration of a cross-sectional view of the workpiece of FIG. 1 after patterning the passivation layer 160, the upper semiconductor layer 144, and the upper channel layer 142 to form a gate electrode opening 226. A patterned resist layer is formed and defines an opening when the gate electrode opening 226 will be formed. An etch is performed to define the gate electrode opening 226 that extend through the capping film 166, the intermediate film 164, the gate dielectric layer 162, the upper semiconductor layer 144, and the upper channel layer 142 to expose the lower semiconductor layer 124. In another embodiment, the lower semiconductor layer 124 might also be partially removed. When etching a layer or film that includes Al, the etching can be performed using reactive ion etching with a chlorine-containing gas, such as $Cl_2$, $BCl_3$, HCl, or the like. When etching a layer of film that includes silicon nitride, the etching can be performed using reactive ion etching with a fluorine-containing gas, such as $SF_6$, $CHF_3$, $CF_4$, or the like.

The etching can be performed as a timed etch, using endpoint detection, or a combination of endpoint detection along with a timed overetch.

Figure 3:
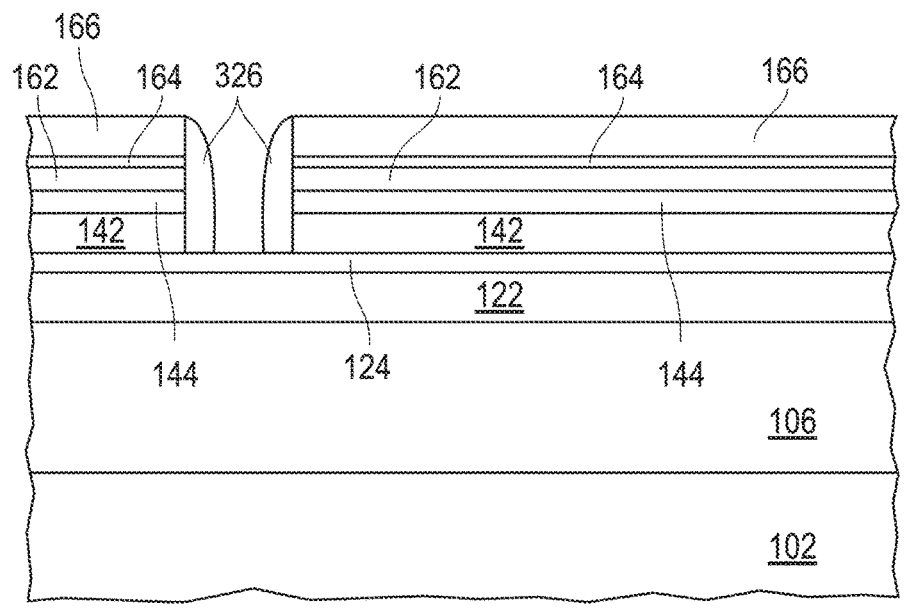
FIG. 3 includes an illustration of the workpiece of FIG. 2 after forming an insulator within the gate electrode opening.

FIG. 3 includes an illustration of a cross-sectional view of the workpiece of FIG. 2 after forming an insulator 326 within the gate electrode opening 226. The insulator 326 electrically insulating a subsequently formed gate electrode from contacting the upper semiconductor layer 144 and the upper channel layer 142. The insulator 326 can be formed as a sidewall spacer by depositing a layer of insulating material over the workpiece and anisotropically etching the insulator 326 within the gate electrode opening 226. The lower semiconductor layer 124 can be exposed adjacent to the base of the insulator 326. In another embodiment, the anisotropic etch is not performed and the insulator 326 lies along the bottom of the gate electrode opening 226, so that the subsequently formed gate electrode is electrically insulated from the lower semiconductor layer 124. The insulator 326 can include an oxide, an oxynitride, a nitride, or any combination thereof. In a particular embodiment, the insulator 326 can include a silicon nitride, an aluminum oxide, a zirconium oxide, a hafnium oxide, a niobium oxide, another suitable gate dielectric material, or any combination thereof. The insulator 326 has a thickness (measured at the base of the insulator 326) in a range of 5 nm to 50 nm.

Figure 4:
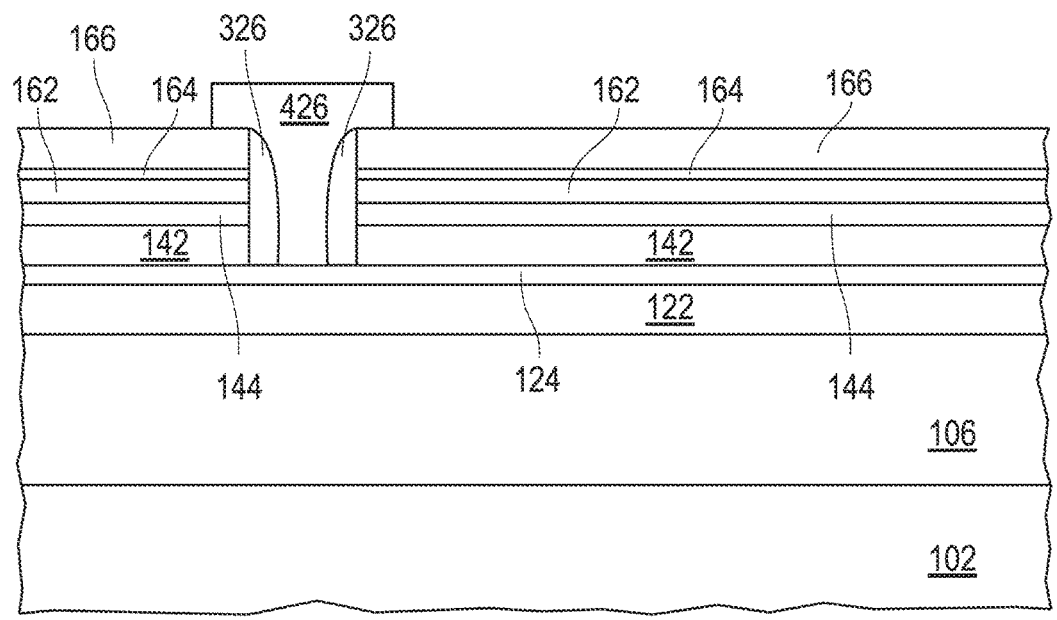
FIG. 4 includes an illustration of the workpiece of FIG. 3 after forming a gate electrode.

In FIG. 4, a gate electrode 426 can be formed by depositing conductive layer over the workpiece. The gate electrode layer can be a p-type doped $Al_eGa_{(1-e)}N$, wherein $0 \le e \le 0.3$. The p-type dopant can include Mg or C. The gate electrode layer has a thickness in a range of 50 nm to 500 nm. The conductive layer is patterned to form the gate electrode 426.

In an embodiment (not illustrated) in which the insulator 326 is formed along the bottom of the gate electrode opening 226, the gate electrode 426 can be formed by depositing conductive layer over the workpiece. The conductive layer can have a composition selected to provide a proper work function for the transistor being formed. The conductive layer can include Ti, TiN, Al, Pd, Pt, W, Au, Ni, or a stack or any combination thereof. In another embodiment, the conductive layer is typically at least 50 wt % aluminum, copper, a noble metal, or an alloy of any of the foregoing. The conductive layer has a thickness in a range of 50 nm to 500 nm. The conductive layer is patterned to form the gate electrode 426.

Figure 5:
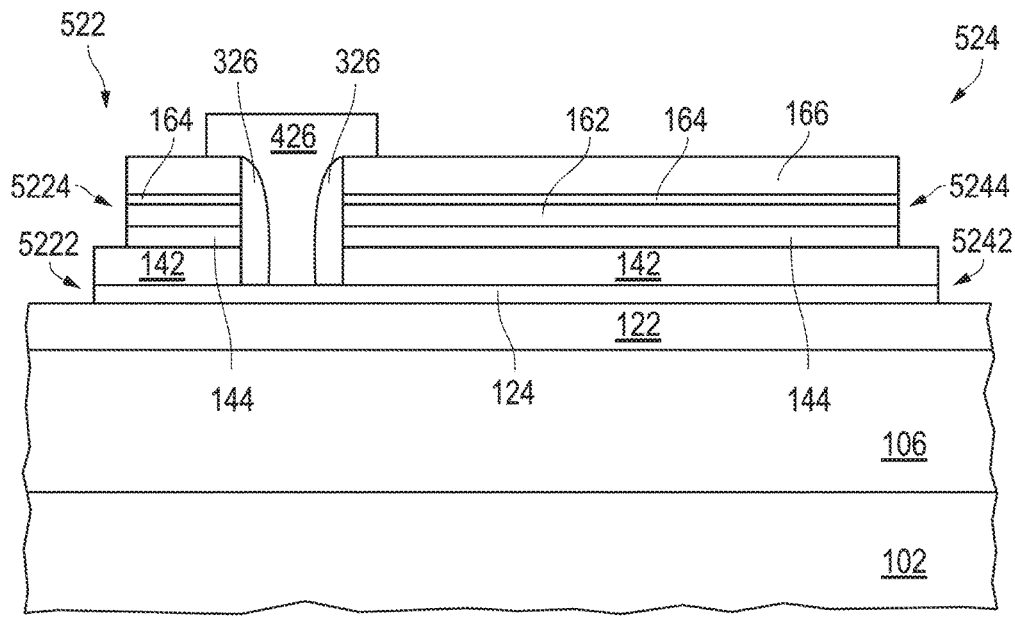
FIG. 5 includes an illustration of the workpiece of FIG. 4 after forming source and drain contact openings.

FIG. 5 includes an illustration of a cross-sectional view of the workpiece of FIG. 1 after patterning the one or more layers to form a source contact opening 522 and a drain contact opening 524. A resist layer (not illustrated) can be formed over the workpiece with openings in the resist layer corresponding to where the source and drain contact openings 522 and 524 are to be formed. The source and drain contact openings 522 and 524 can be formed by etching to expose the lower semiconductor layer 124 at portions 5222 and 5242 of the openings 522 and 524, respectively, and expose the upper semiconductor layer 144 at portions 5224 and 5244 of the openings 522 and 524, respectively. When etching a layer or film that includes Al, the etching can be performed using reactive ion etching with a chlorine-containing gas, such as $Cl_2$, $BCl_3$, HCl, or the like. When etching a layer of film that includes silicon nitride, the etching can be performed using reactive ion etching with a fluorine-containing gas, such as $SF_6$, $CHF_3$, $CF_4$, or the like. The etching can be performed as a timed etch, using endpoint detection, or a combination of endpoint detection along with a timed overetch.

Figure 6:
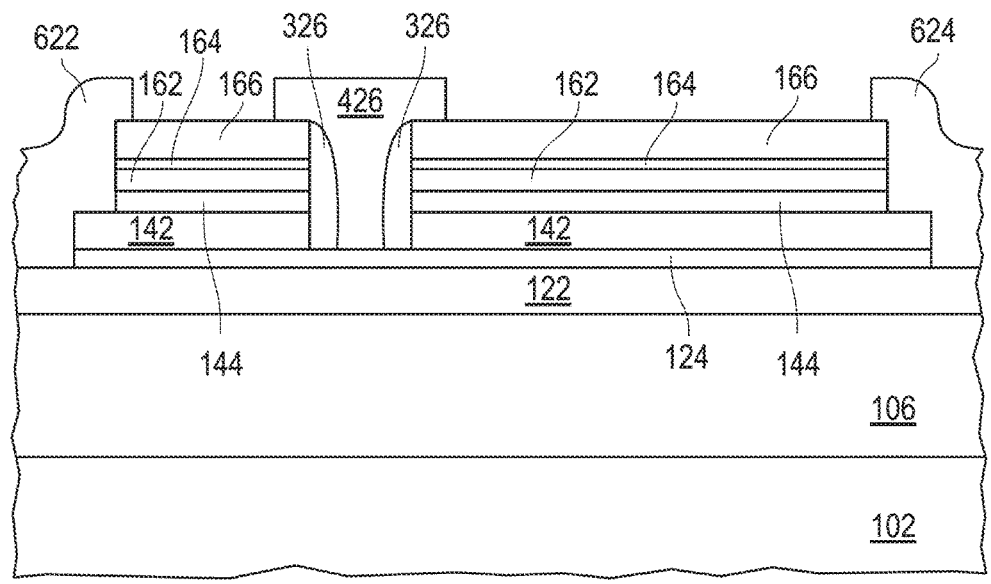
FIG. 6 includes an illustration of the workpiece of FIG. 5 after forming source and drain electrodes.

In FIG. 6, the source and drain electrodes 622 and 624 are formed within the source and drain contact openings 522 and 524. The different depths of the portions 5222, 5224, 5242, and 5244 of the source and drain contact openings 522 and 524 allow the source and drain electrodes to form stepped contacts. The stepped contacts allow lower contact resistance to each of the channel layers as compared to source and drain electrodes formed to single depth.

The source and drain electrodes 622 and 624 can be formed by depositing conductive layer over the workpiece. The conductive layer can have a composition that includes at least 50 wt % aluminum, copper, a noble metal, or an alloy of any of the foregoing. The conductive layer has a thickness in a range of 50 nm to 500 nm. The conductive layer is patterned to form the source electrode 622 and the drain electrode 624.

Figure 7:
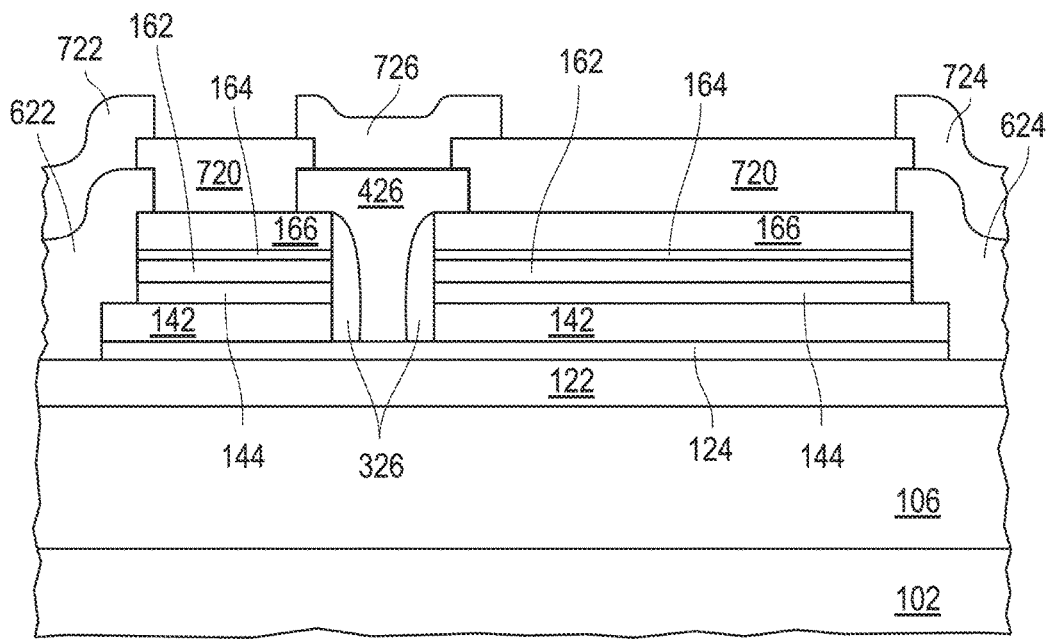
FIG. 7 includes an illustration of the workpiece of FIG. 6 after forming an interlevel dielectric layer interconnects and a gate shielding plate.

In FIG. 7, interlevel dielectric (ILD) layer 720, interconnects 722 and 724, and gate shielding plate 726. The gate shielding plate 726 extends laterally further toward the drain as compared to the gate electrode 626. The ILD layer 720 can include one or more films of oxide, nitride, or oxynitride and have a thickness in a range of 0.2 microns to 4 microns. Each of the interconnects 722 and 724 and the gate shielding plate 726 can include one or more films of conductive material. The interconnects are typically at least 50 wt % aluminum, copper, a noble metal, or an alloy of any of the foregoing.

Figure 8:
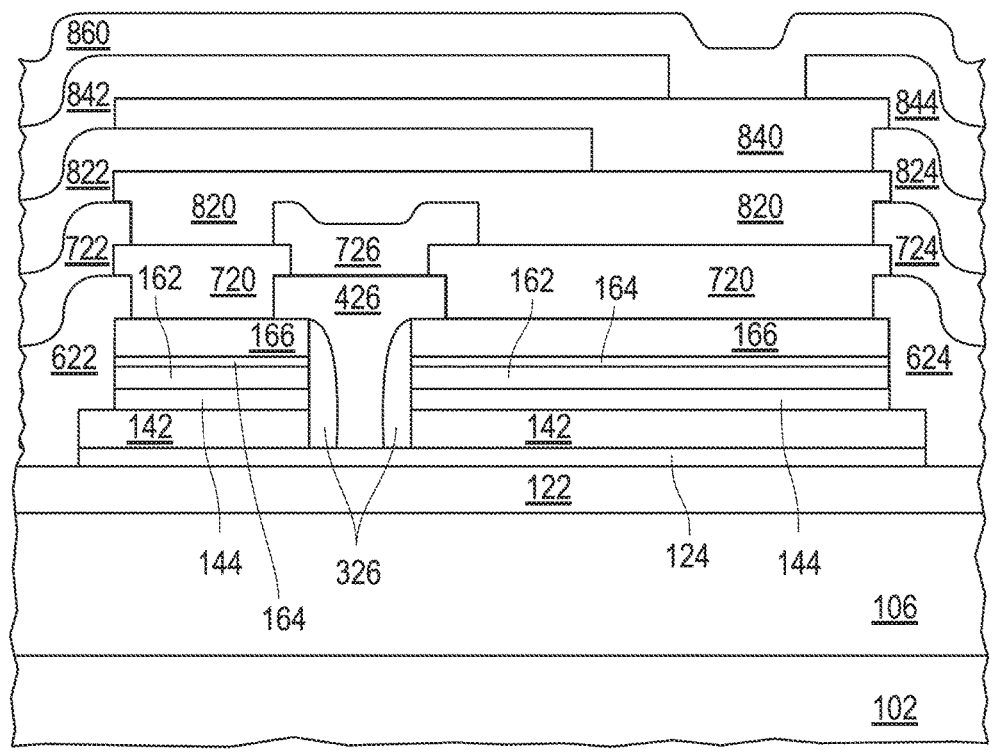
FIG. 8 includes an illustration of the workpiece of FIG. 7 after forming a substantially completed electronic device.

FIG. 8 includes an illustration of a substantially completed electronic device. ILD layers 820 and 840, interconnect 824, source shielding plates 822 and 842, a drain shielding plate 844, and a protective passivation layer 860 are formed. The source shielding plate 822 extends laterally further toward the drain as compared to each of the gate electrode 426 and the gate shielding plate 726, and the source shielding plate 842 extend laterally further toward the drain as compared to each of the gate electrode 426, the gate shielding plate 726, and the source shielding plate 822. Each of the ILD layers 820 and 840 can include one or more films of oxide, nitride, or oxynitride and have a thickness in a range of 0.2 microns to 5 microns. The ILD layer 820 and 840 can have the same or different composition as compared to one another or may have the same or different thickness as compared to one another. Each of the interconnect 824 and the shielding plates 822, 842, and 844 can include one or more films of conductive material. The interconnects are typically at least 50 wt % aluminum, copper, a noble metal, or an alloy of any of the foregoing. The protective passivation layer 860 helps to reduce the likelihood that mobile ions, such as sodium, or moisture will enter underlying layers. The protective passivation layer 860 can include one or more films of oxide, nitride, or oxynitride, wherein at least one of which is a nitride film, and have a thickness in a range of 0.2 microns to 5 microns. In the embodiment as illustrated, the HEMT is an enhancement-mode transistor.

Figure 9:
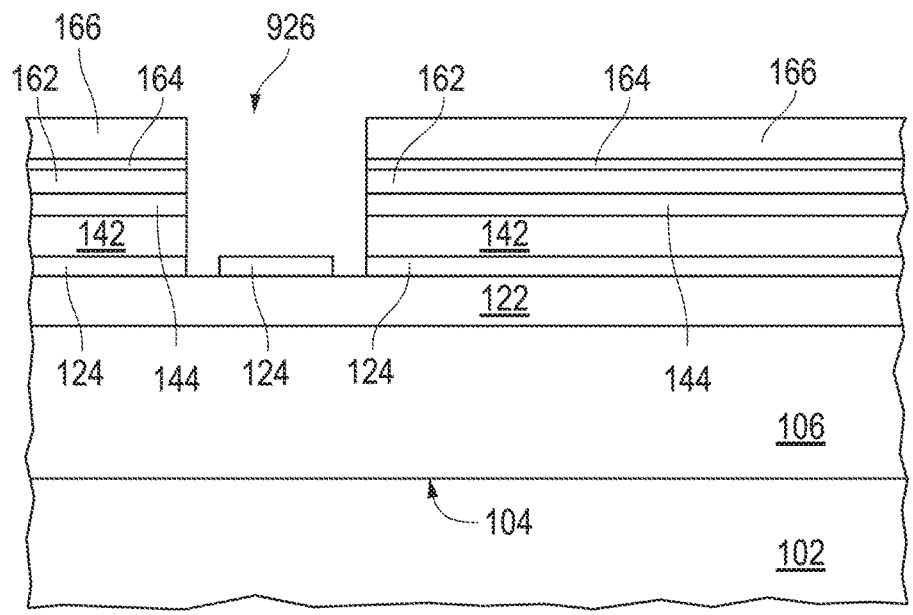
FIG. 9 includes an illustration of the workpiece of FIG. 1 after patterning layers to define an opening.

FIGS. 9 to 12 illustrate another embodiment in which a conductive member may be formed to electrically connect the channel layers to each other adjacent to the gate electrode. After forming the layers illustrated in FIG. 1, layers 124, 142, 144, and 160 are patterned to define an opening 926, as illustrated in FIG. 9. With the opening 926, a portion of the lower semiconductor layer 124 remains, so that the subsequently-formed gate electrode does not directly contact the lower channel layer 122. As will be described later with respect to another embodiment, the lower semiconductor layer 124 is removed, as a barrier layer will be formed after forming an insulating layer and before forming the gate electrode. In a further embodiment (not illustrated), the opening 926 may have a stepped structure, so that an upper surface of the upper channel layer 142 is exposed within the opening 926, which may allow for a lower resistance contact to be made to the upper channel layer 142. In another embodiment, the lower semiconductor layer 124 may not be patterned (i.e., the lower semiconductor layer 124 is continuous within opening 926). In yet another embodiment, the opening 926 may have a stepped structure, so that an upper surface of layer 144 is exposed within opening 926.

Figure 10:
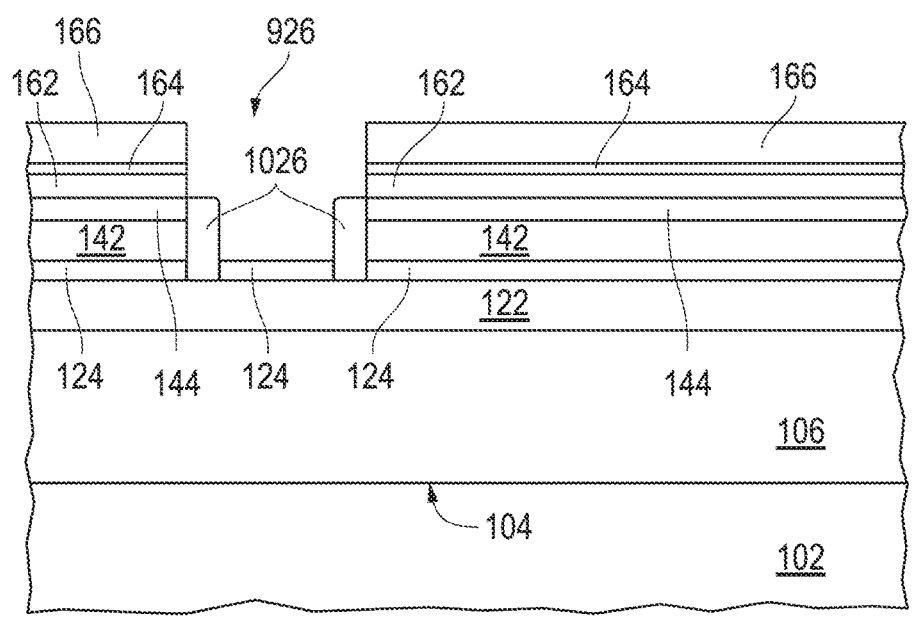
FIG. 10 includes an illustration of the workpiece of FIG. 9 after forming a conductive member within a portion of the opening.

A conductive member 1026 is formed within the opening 926, as illustrated in FIG. 10. The conductive member 1026 electrically connects the lower and upper channel layers 122 and 142 to each other. The conductive member 1026 may be formed using a variety of different techniques. In an embodiment, a heavily doped semiconductor layer may be selectively grown from the layers 122, 124, 142, and 144. The semiconductor layer may have a semiconductor composition similar to any of the layers 122, 124, 142, and 144, and in a particular embodiment, the semiconductor composition includes $Al_fGa_{(1-f)}N$, wherein $0.0 \leq f \leq 0.35$. The semiconductor layer can be doped with an electron donor, such as Si or another suitable donor, to a concentration of at least $1 \times 10^{18}$ atoms/cm$^3$. The portion of the semiconductor layer overlying the central portion of the opening 926 is removed to form the conductive member 1026, so that the conductive member 1026 does not electrically short the channel layers 122 and 142 to the subsequently-formed gate electrode.

In another embodiment, the conductive member 1026 can be formed by depositing a conductive layer within the opening 926 and anisotropically etching the conductive layer. The conductive layer may include a single conductive film or a plurality of films. For example, the conductive layer can include a Ti film as a diffusion barrier film and an aluminum film. In another example, the conductive layer can include a tungsten layer. In another embodiment, the conductive member 1026 can be formed by selectively doping the layers 124, 142, and 144. For example, a single implant or chain of implants can be performed to dope portions of the layers 124, 142, and 144 to form the conductive member 1026. The embodiments described with respect to the conductive member 1026 are meant to illustrate and not limit the scope of the appended claims.

Figure 11:
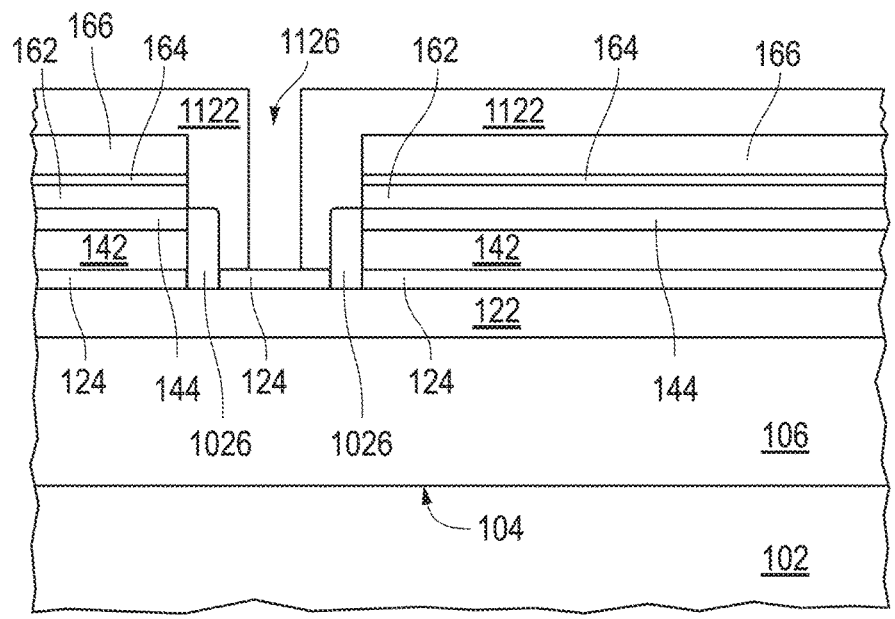
FIG. 11 includes an illustration of the workpiece of FIG. 10 after forming a patterned insulating layer that defines a gate electrode opening.

In FIG. 11, an insulating layer 1122 is formed over with workpiece and within the opening 926. The insulating layer 1122 is patterned to define an opening 1126 for the gate electrode. The opening 1126 extends to the lower semiconductor layer 124. A portion of the insulating layer 1122 is an insulator that is disposed between the conductive member 1026 and the subsequently-formed gate electrode. If all of the lower semiconductor layer 124 within the opening 926 was previously removed, another semiconductor layer having a composition and thickness similar to the semiconductor layer 124 or 144 can be formed within the opening 1126 before forming the gate electrode. In a particular embodiment, such other semiconductor layer can be formed using a selective growth technique.

Figure 12:
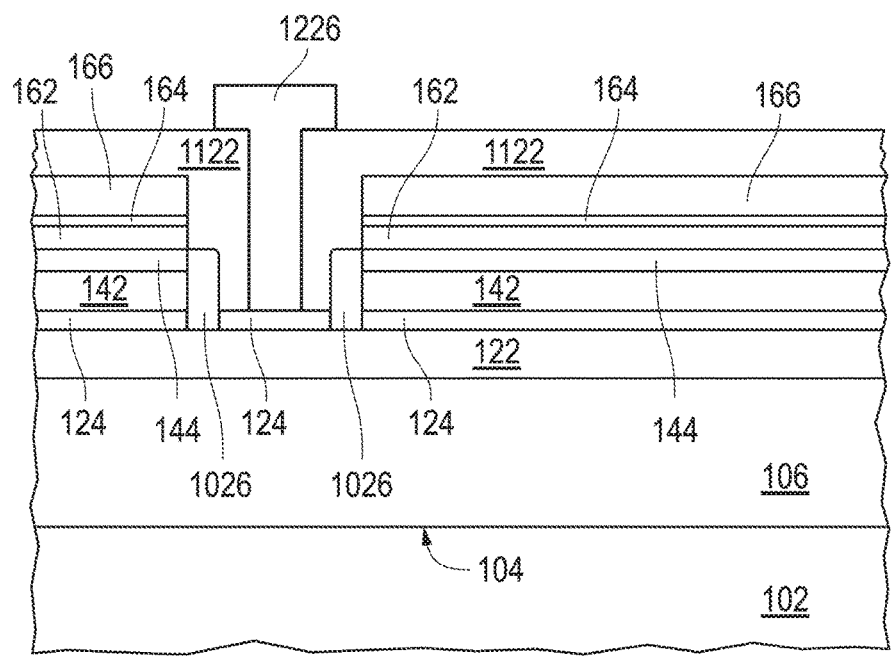
FIG. 12 includes an illustration of the workpiece of FIG. 11 after forming a gate electrode.

A gate electrode 1226 is formed within the opening 1126, as illustrated in FIG. 12. The gate electrode 1226 can be formed using any of the materials or techniques as previously described with respect to the gate electrode 426. Processing can be continued as previously described with respect to FIGS. 5 to 8 to form a substantially completed electronic device. The conductive member 1026 is adjacent to the insulating layer 1122, which is disposed between the gate electrode 1226 and the conductive member 1026. Furthermore, the conductive member 1026 is spaced apart from the source and drain electrodes and is closer to the gate electrode 1226 than each of the source and drain electrodes.

Figure 13:
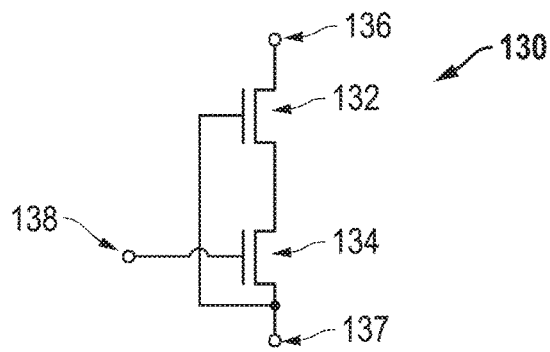
FIG. 13 includes schematic diagram of a cascode circuit.

In another embodiment, the gate structures as previously described can be incorporated as a switch transistor of a cascode circuit. Although the gate electrode 426 is illustrated in the figures, after reading this specification, skilled artisans will understand that the gate structure as illustrated can be replaced by the conductive member 1026 and gate electrode 1226. FIG. 13 includes a schematic of a cascode circuit 130 that includes a control transistor 132 and a switch transistor 134. A drain of the transistor 132 is coupled to a high-side power supply terminal 136, a source of the transistor 132 is coupled to a drain of the transistor 134, and a gate of the transistor 132 is coupled to a source of the transistor 134 and a low-side power supply terminal 137. In a particular embodiment, the low-side power supply terminal 137 may be at 0 V. A gate of the transistor 134 is coupled to a control terminal 138. In the embodiment as illustrated in FIG. 13, the switch transistor 134 is a switching transistor for the cascode circuit 130. The transistor 132, 134, or each of transistors 132 and 134 can be a high electron mobility transistor (HEMT). As illustrated in the embodiment of FIG. 13, the transistors 132 and 134 are HEMTs. In a particular embodiment, control transistor 132 is a depletion-mode transistor, and the switch transistor 134 is an enhancement mode transistor.

Figure 14:
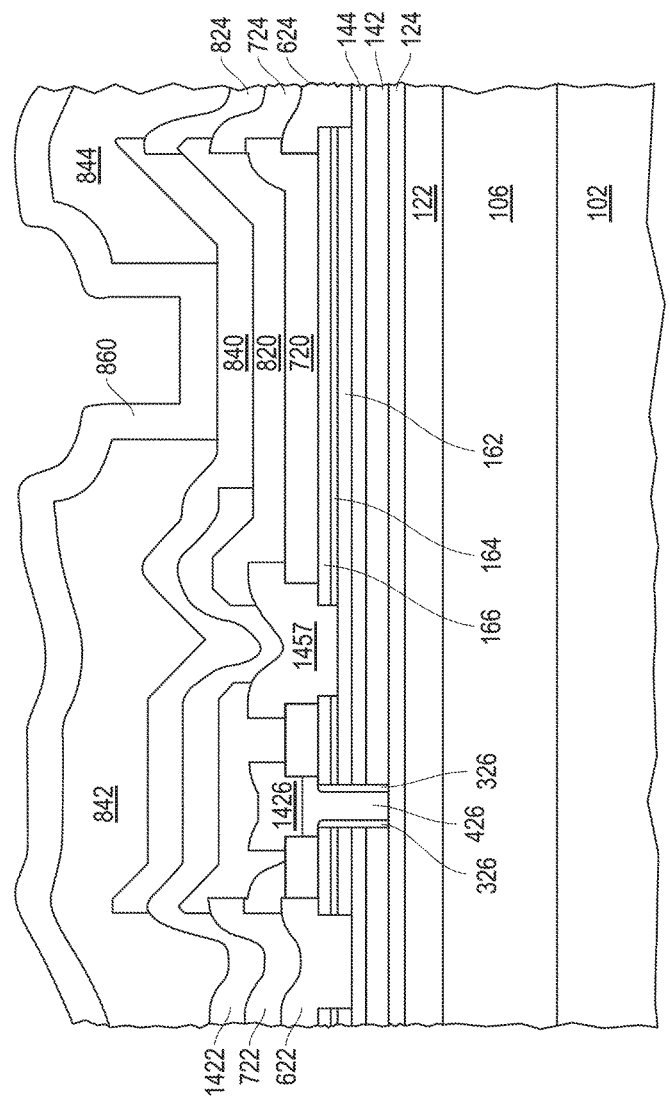
FIG. 14 includes a physical design corresponding to the circuit in FIG. 13 that includes a switch transistor having a gate structure that includes an insulator and gate electrode.

FIG. 14 includes an illustration of a cross-sectional view of an embodiment of a physical design in which the switch transistor 134 has the gate structure, including the insulator 326 and gate electrode 426, as previously described. An interconnect 1426 is used to connect the gate electrode 426 to another part of the electronic device, such as a gate driver. The control transistor 132 includes a gate electrode 1457 that can be formed as the same time as forming the source and drain electrodes 622 and 624 and the interconnect 1426. In the embodiment as illustrated in FIG. 14, the gate dielectric film 162 is disposed between the gate electrode 1457 and the upper semiconductor layer 144. A source shield plate 1422 can provide shielding and also provide an electrical connection between the gate electrode 1457 of the control transistor 132 and the source electrode 622 for the cascode circuit 130.

Figure 15:
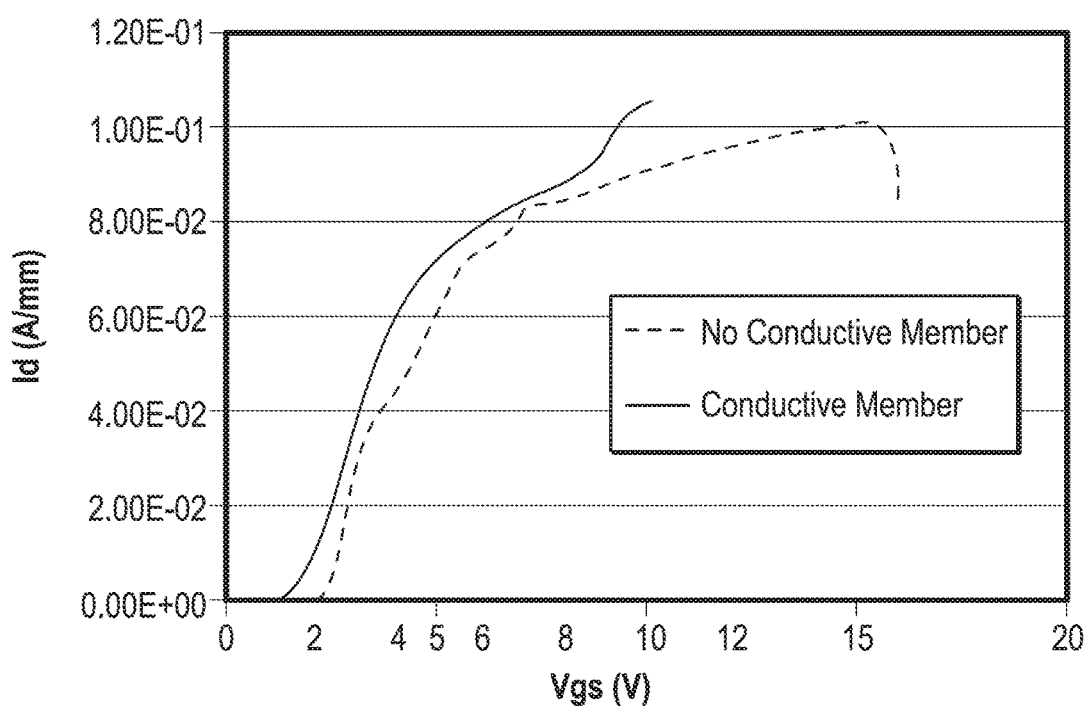
FIG. 15 includes plots of drain current as a function of gate voltage for the switch transistors when implemented in the physical design of or similar to FIG. 14.

FIG. 15 includes plot of a simulation of drain current (Id) as a function of the voltage on each of the gate electrodes 426 and 1226 (Vgs) of the switch transistor 134. For the gate electrode 426, when Vgs is in a range of 2 V to 3 V, the upper channel 142 turns on, and current steeply increases with Vgs. When Vgs is in a range of 3 V to 5 V, the lower channel 122 also turns on, giving an extra contribution to the current flow to the drain. When Vgs is in a range of 5 V to 15 V, current saturates due to channel pinch-off. When Vgs is at 15 V and higher, the drain current steeply decreases due to the injection of electrons into the gate (supplied by the drain). Unlike the embodiment with the gate electrode 426, the embodiment with the gate electrode 1226 allows significant current flow through the channel layers 122 and 142 when the transistor turns on. Thus, for the gate electrode 1226, when Vgs is in a range of 1 V to 2 V, the lower and upper channels 122 and 142 turn on, and current steeply increases with Vgs. When Vgs is in a range of 5 V to 15 V, current saturates due to channel pinch-off. When comparing transistors with the gate electrodes 426 and 1226, the transistor with the gate electrode 1226 turns on at a lower gate voltage and has 1% to 10% higher drain current when Vgs is in a range of 3 V to 10 V. At a drain current of 0.1 A/mm, Vgs is approximately 5 volts lower for the transistor with the conductive member 1026 and the gate electrode 1226, as compared to the transistor with the gate electrode 426.

An electronic device can include a HEMT having more than two channel layers. The amount of current that can flow through the HEMT can increase as the number of channel layers increases. The semiconductor layers between the channel layers of the HEMT can have an Al content that increases with the distance from the substrate.

Embodiments as described herein can help to form a HEMT with at least two channel layers. In an embodiment, current for at least one channel layer can be turned on without significantly affecting current flow for an adjacent lower channel layer. In another embodiment, current can be turned on for both channel layers at a lower gate-to-source voltage and have relatively higher drain current.

In a cascode circuit, a switch transistor can include the gate structure as described herein and allow the cascode circuit to be integrated with the same channel layers for both the control and switch transistors, wherein the control transistor is a depletion-mode transistor, and the switch transistor is an enhancement-mode transistor. Such a configuration can be used for many different types of semiconductor materials and is particularly well suited for HEMTs. Such HEMTs can be based on III-N semiconductor materials, and AlGaN and GaN in particular.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device comprising:
a first channel layer;
a second channel layer overlying the first channel layer and having an opening extending therethrough;
an insulator within the opening; and
a gate electrode extending into the opening, wherein the insulator is disposed between the gate electrode and the second channel layer,
wherein a double channel transistor includes the first and second channel layers and the gate electrode.

Embodiment 2

The electronic device of Embodiment 1, wherein the insulator is an oxide, an oxynitride, or a nitride, such as a silicon nitride, an aluminum oxide, a hafnium oxide, a zirconium oxide, or a niobium oxide.

Embodiment 3

The electronic device of Embodiment 1, further comprising a first semiconductor layer disposed between the first and second channel layers; and a second semiconductor layer disposed over the second channel layer.

Embodiment 4

The electronic device of Embodiment 3, wherein the insulator is disposed between the gate electrode and the second semiconductor layer.

Embodiment 5

The electronic device of Embodiment 3, wherein the first channel layer includes $Al_aGa_{(1-a)}N$, wherein $0.0 \leq a \leq 0.1$; the first semiconductor layer includes $Al_bGa_{(1-b)}N$, wherein $0.10 \leq b \leq 0.30$; the second channel layer includes $Al_cGa_{(1-c)}N$, wherein $0.0 \leq c \leq 0.15$; and the second semiconductor layer includes $Al_dGa_{(1-d)}N$, wherein $0.15 \leq d \leq 0.35$.

Embodiment 6

The electronic device of Embodiment 5, wherein a=0, and c=0.

Embodiment 7

The electronic device of Embodiment 3, wherein the first channel layer is thicker than the second channel layer and has a thickness of at most 1000 nm.

Embodiment 8

The electronic device of Embodiment 3, further comprising a passivation layer overlying the second semiconductor layer.

Embodiment 9

The electronic device of Embodiment 3, wherein each of the first and second channel layers and the first and second semiconductor layers has a dopant concentration of at most $1 \times 10^{15}$ atoms/cm$^3$.

Embodiment 10

The electronic device of Embodiment 1, further comprising a source electrode overlying the substrate, wherein a lowermost surface of the source electrode overlies the second semiconductor layer; and a drain electrode overlying the substrate, wherein a lowermost surface of the source electrode overlies the second semiconductor layer.

Embodiment 11

The electronic device of Embodiment 1, further comprising a conductive member adjacent to the insulator, wherein the conductive member electrically connects the first and second channel layers to each other.

Embodiment 12

An electronic device including a transistor, the transistor comprising:
a first channel layer;
a second channel layer overlying the first channel layer;
a source electrode;
a drain electrode; and
a conductive member disposed between the source and drain electrodes and electrically connected to the first and second channel layers.

Embodiment 13

An electronic device comprising a cascode circuit comprising a switch transistor and a control transistor, wherein:
the switch transistor includes at least two channel layers, wherein the switch transistor comprises:
a first channel layer;
a second channel layer overlying the first channel layer and having an opening extending therethrough;

an insulator within the opening; and a switch gate electrode extending into the opening, wherein the insulator is disposed between the switch gate electrode and the second channel layer; and the control transistor includes at least two channel layers, wherein the control transistor comprises:
the first channel layer;
the second channel layer; and
a control gate electrode, wherein all of the control electrode overlies the first and second channel layers.

Embodiment 14

The electronic device of Embodiment 13, wherein the switch transistor is an enhancement-mode HEMT, and the control transistor is a depletion mode HEMT.

Embodiment 15

A process of forming an electronic device comprising:
providing a workpiece including a substrate, a first channel layer overlying the substrate, and a second channel layer overlying the first channel layer;
patterning the second channel layer to define an opening extending therethrough;
forming an insulator within the opening; and
forming a first gate electrode that extends into the opening after forming the insulator, wherein a first transistor includes the first and second channel regions and the first gate electrode.

Embodiment 16

The process of Embodiment 15, wherein the first gate electrode is insulated from the second channel layer by the insulator.

Embodiment 17

The process of Embodiment 15, wherein providing the workpiece comprises:
forming the first channel layer over the substrate;
forming a first semiconductor layer after forming the first channel layer;
forming the second channel layer after forming the first semiconductor layer; and
forming a second semiconductor layer after forming the second channel layer.

Embodiment 18

The process of Embodiment 17, further comprising:
forming a source electrode to the first and second channel layers, and
forming a drain electrode to the first and second channel layers, wherein:
providing the workpiece comprises forming a buffer layer over the substrate before forming the first channel layer;
forming the first channel layer includes forming a first GaN channel layer over the buffer layer, wherein the first GaN channel layer has a thickness in a range of 11 nm to 1000 nm;
the first semiconductor includes $Al_bGa_{(1-b)}N$, wherein $0.10 \leq b \leq 0.30$ and has a thickness in a range of 10 nm to 40 nm;

forming the second channel layer comprises forming a second GaN channel layer over the first semiconductor layer, is thinner than the first channel layer, and has a thickness in a range of 10 nm to 200 nm; and the second semiconductor layer includes $Al_dGa_{(1-d)}N$, wherein $0.15 \leq d \leq 0.35$ and has a thickness in a range of 10 nm to 40 nm.

Embodiment 19

The process of Embodiment 15, wherein each of the first and second channel layers has a dopant concentration of at most $1 \times 10^{15}$ atoms/cm$^3$.

Embodiment 20

The process of Embodiment 15, further comprising forming a second gate electrode of a second transistor over the first and second channel layers, wherein a drain of the first transistor is coupled to the source of the second transistor.

Embodiment 21

The process of Embodiment 20, wherein the first transistor is an enhancement-mode, double-channel HEMT, and the second transistor is a depletion-mode, double-channel HEMT.

Embodiment 22

The process of Embodiment 15, further comprising:
forming an insulating layer over the second channel layer;
patterning the insulating layer to define a source contact opening and a drain contact opening, wherein the second semiconductor layer is exposed along a bottom of the source and drain contact openings; and
forming a source electrode and a drain electrode within the source and drain contact openings.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a first channel layer;
   a first semiconductor layer overlying the first channel layer;
   a second channel layer overlying the first channel layer;
   a second semiconductor layer overlying the second channel layer, wherein the first semiconductor layer has a lower Al content as compared to the second semiconductor layer;
   an insulator within an opening extending through the second semiconductor layer and the second channel layer; and
   a gate electrode extending into the opening, wherein the insulator is disposed between the gate electrode and each of the second semiconductor layer and the second channel layer,
   wherein a double channel transistor includes the first and second channel layers and the gate electrode.

2. The electronic device of claim 1, wherein the insulator is an oxide, an oxynitride, or a nitride.

3. The electronic device of claim 1, wherein:
   the first semiconductor layer includes $Al_bGa_{(1-b)}N$, wherein $0.10 \le b \le 0.30$; and
   the second semiconductor layer includes $Al_dGa_{(1-d)}N$, wherein $0.15 \le d \le 0.35$.

4. The electronic device of claim 1, wherein the insulator is disposed between the gate electrode and the second semiconductor layer.

5. The electronic device of claim 3, wherein:
   the first channel layer includes $Al_aGa_{(1-a)}N$, wherein $0.0 \le a \le 0.1$; and
   the second channel layer includes $Al_cGa_{(1-c)}N$, wherein $0.0 \le c \le 0.15$.

6. The electronic device of claim 5, wherein a=0, and c=0.

7. The electronic device of claim 1, wherein the first channel layer is thicker than the second channel layer and has a thickness of at most 1000 nm.

8. The electronic device of claim 1, further comprising a passivation layer overlying the second semiconductor layer.

9. The electronic device of claim 1, wherein each of the first and second channel layers and the first and second semiconductor layers has a dopant concentration of at most $1 \times 10^{15}$ atoms/cm$^3$.

10. The electronic device of claim 1, further comprising:
    a source electrode overlying the substrate, wherein a lowermost surface of the source electrode overlies the second semiconductor layer; and
    a drain electrode overlying the substrate, wherein a lowermost surface of the source electrode overlies the second semiconductor layer.

11. The electronic device of claim 1, further comprising a conductive member electrically connected to the first and second channel layers, wherein the conductive member is disposed between the insulator and the second channel layer.

12. An electronic device including a transistor, the transistor comprising:
    a first channel layer;
    a second channel layer overlying the first channel layer;
    a gate electrode;
    a source electrode;
    a drain electrode; and
    a conductive member is electrically connected to the first and second channel layers, is between and spaced apart from the source and drain electrodes, and does not electrically short the first and second channel layers to the gate electrode.

13. A process of forming an electronic device comprising:
    providing a workpiece including a substrate, a first channel layer overlying the substrate, a first semiconductor layer and overlying the first channel layer, a second channel layer overlying the first semiconductor layer, and a second semiconductor layer overlying the second channel layer, wherein the first semiconductor layer has a lower Al content as compared to the second semiconductor layer;
    patterning the second semiconductor layer and the second channel layer to define an opening extending through the second semiconductor layer and the second channel layer;
    forming an insulator within the opening; and
    forming a first gate electrode that extends into the opening after forming the insulator, wherein a first transistor includes the first and second channel regions and the first gate electrode.

14. The process of claim 13, wherein the first gate electrode is insulated from the second channel layer by the insulator.

15. The process of claim 13, wherein providing the workpiece comprises:
    forming the first channel layer over the substrate;
    forming a first semiconductor layer after forming the first channel layer;
    forming the second channel layer after forming the first semiconductor layer; and
    forming a second semiconductor layer after forming the second channel layer.

16. The process of claim 15, further comprising:
    forming a source electrode to the first and second channel layers, and
    forming a drain electrode to the first and second channel layers,
    wherein:
      providing the workpiece comprises forming a buffer layer over the substrate before forming the first channel layer;
      forming the first channel layer includes forming a first GaN channel layer over the buffer layer, wherein the first GaN channel layer has a thickness in a range of 11 nm to 1000 nm;
      the first semiconductor includes $Al_bGa_{(1-b)}N$, wherein $0.10 \le b \le 0.30$ and has a thickness in a range of 10 nm to 40 nm;
      forming the second channel layer comprises forming a second GaN channel layer over the first semiconductor layer, is thinner than the first channel layer, and has a thickness in a range of 10 nm to 200 nm; and
      the second semiconductor layer includes $Al_dGa_{(1-d)}N$, wherein $0.15 \le d \le 0.35$ and has a thickness in a range of 10 nm to 40 nm.

17. The process of claim 13, wherein each of the first and second channel layers has a dopant concentration of at most $1 \times 10^{15}$ atoms/cm$^3$.

18. The process of claim 13, further comprising forming a second gate electrode of a second transistor over the first and second channel layers, wherein a drain of the first transistor is coupled to the source of the second transistor.

19. The process of claim 18, wherein the first transistor is an enhancement-mode, double-channel HEMT, and the second transistor is a depletion-mode, double-channel HEMT.

20. The process of claim 13, further comprising:
forming an insulating layer over the second channel layer;
patterning the insulating layer to define a source contact opening and a drain contact opening, wherein the second semiconductor layer is exposed along a bottom of the source and drain contact openings; and
forming a source electrode and a drain electrode within the source and drain contact openings.

\* \* \* \* \*